United States Patent [19]

Conlin et al.

[11] Patent Number: 4,718,185

[45] Date of Patent: Jan. 12, 1988

[54] MODULAR SOLAR GENERATING SYSTEM

[75] Inventors: Kevin L. Conlin; Michael P. Cantrell, both of Houston, Tex.

[73] Assignee: Solar Signage, Inc., Stafford, Tex.

[21] Appl. No.: 928,533

[22] Filed: Nov. 7, 1986

[51] Int. Cl.⁴ ............................................. G09F 13/00
[52] U.S. Cl. ........................................ 40/442; 136/251; 136/291; 320/2; 320/21; 362/183
[58] Field of Search ................. 136/251, 291, 293; 320/2, 21; 362/183; 40/442

[56] References Cited

U.S. PATENT DOCUMENTS

| | | | |
|---|---|---|---|
| 3,376,164 | 4/1968 | Bachwansky | 136/251 |
| 4,009,535 | 3/1977 | Stock | 40/546 |
| 4,040,867 | 8/1977 | Forestieri et al. | 136/244 |
| 4,053,326 | 10/1977 | Forrat | 136/256 |
| 4,170,507 | 10/1979 | Keeling et al. | 156/245 |
| 4,180,414 | 12/1979 | Diamond et al. | 136/246 |
| 4,200,904 | 4/1980 | Doan | 362/183 |
| 4,239,555 | 12/1980 | Scharlack | 136/251 |
| 4,281,369 | 7/1981 | Batte | 362/183 |
| 4,319,310 | 3/1982 | Kingsley | 362/183 |
| 4,384,317 | 5/1983 | Stackpole | 362/183 |
| 4,392,009 | 7/1983 | Napoli | 136/251 |
| 4,433,200 | 2/1984 | Jester et al. | 136/251 |
| 4,441,143 | 4/1984 | Richardson | 362/183 |
| 4,481,562 | 11/1984 | Hickson | 362/183 |
| 4,484,104 | 11/1984 | O'Brien | 315/86 |
| 4,486,820 | 12/1984 | Baba et al. | 362/183 |
| 4,491,681 | 1/1985 | Kirpich | 136/246 |
| 4,567,316 | 1/1986 | Hollaus et al. | 136/246 |
| 4,595,789 | 6/1986 | Nagase et al. | 136/244 |
| 4,626,852 | 12/1986 | Dodge | 340/985 |

FOREIGN PATENT DOCUMENTS 56-94675  7/1981  Japan .................................. 136/251

*Primary Examiner*—Aaron Weisstuch
*Attorney, Agent, or Firm*—Arnold, White & Durkee

[57] ABSTRACT

A modular solar generating system is disclosed. The system includes a plurality of self-contained solar modules which are interconnectedly disposed in an array about the perimeter of a rigid framework housing a sign, light, or other load means necessitating electrical power during the night time hours. The modules themselves consist of a photovoltaic plate sandwiched between two suitable cover plates, including in this arrangement one or more continuous conductors. The modules are linked together by way of male and female plug connectors whereby the array may then be electrically connected to a battery. When the modular system is arranged in this fashion and exposed to incident sunlight for an appropriate period of time, power may be provided to a sign, light or other electrical apparatus for nighttime use.

16 Claims, 8 Drawing Figures

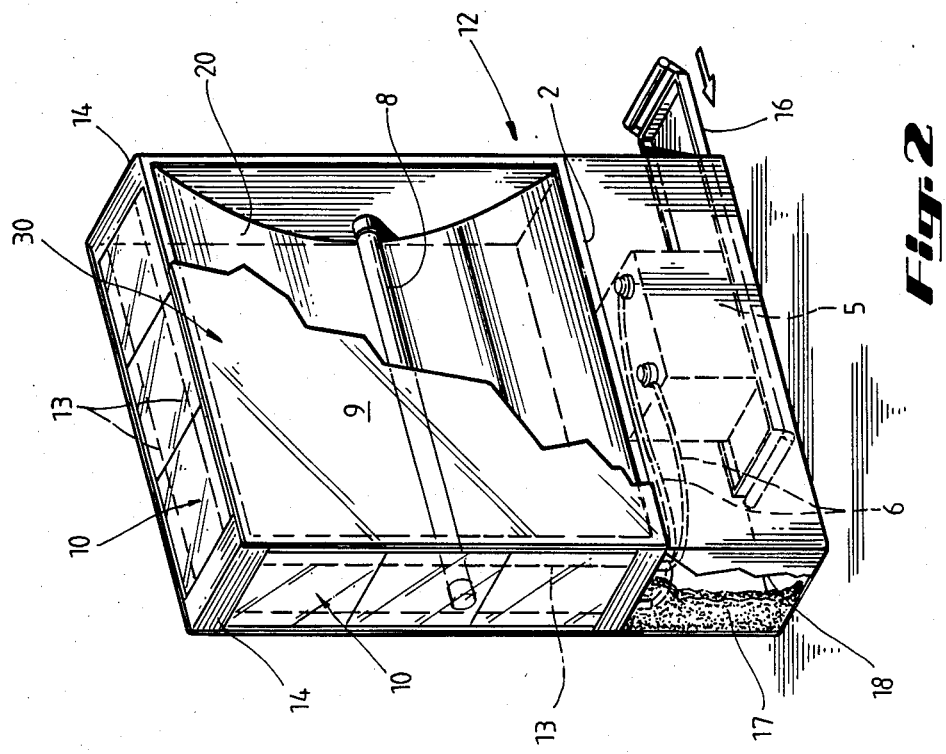
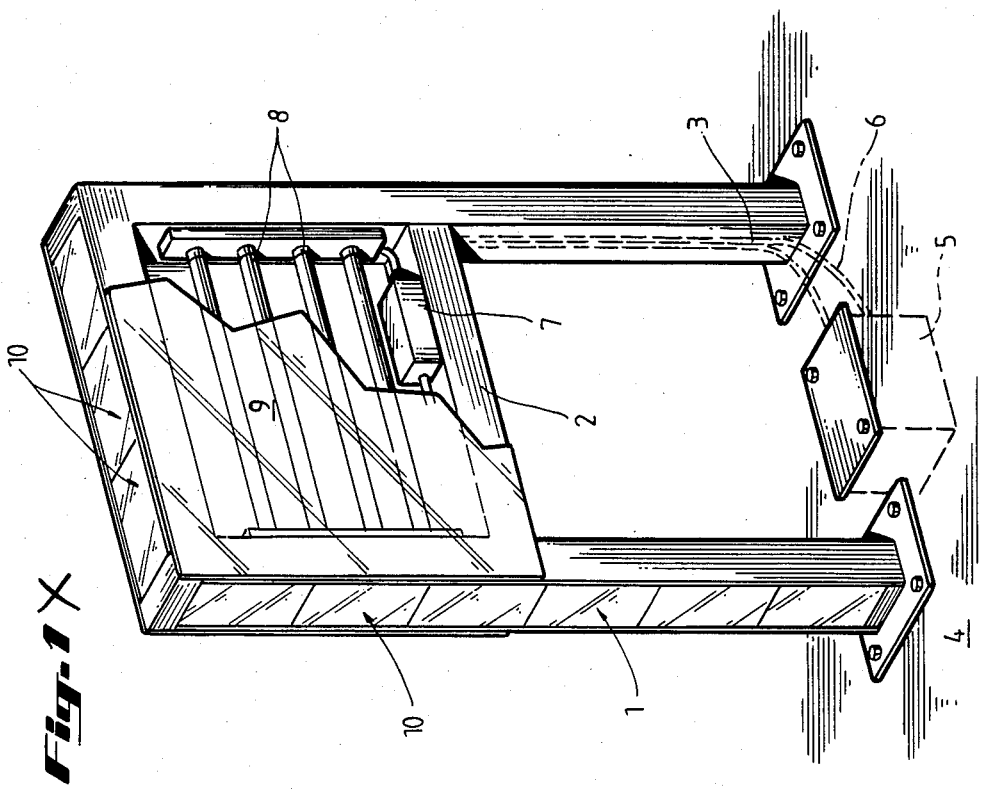

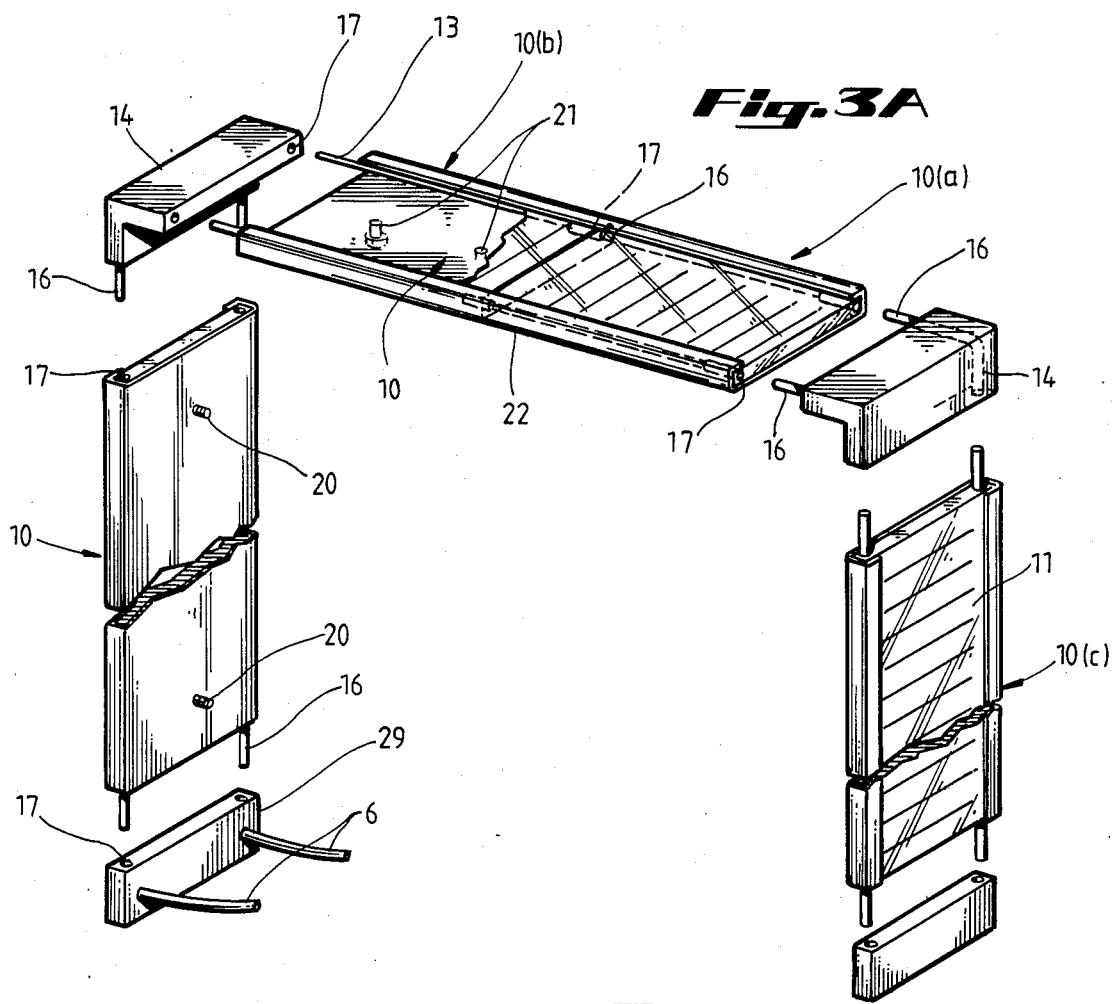
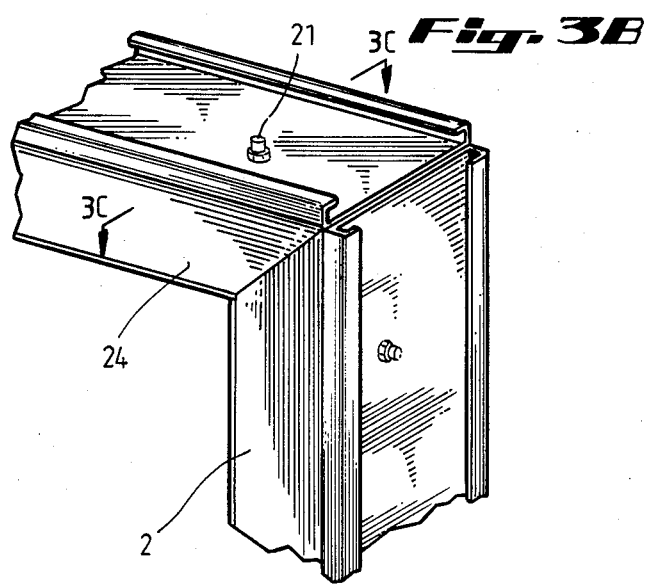
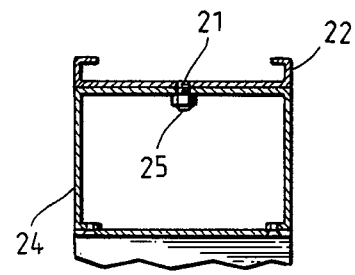

MODULAR SOLAR GENERATING SYSTEM

BACKGROUND

The present invention relates generally to a modular solar generating system for use in providing power to illuminated outdoor signs. More particularly, this invention relates to an illuminated outdoor sign comprised of a rigid upright frame about which a plurality of solar modules are interconnectedly disposed. These modules are linked to a battery whereby electricity produced by the solar modules is stored for nighttime use in a lighting element of the sign or in some other fashion where electric power is required.

Illuminated signs, billboards and warning signals are a common sight in both cities and along the sides of highways or major roads. While illuminated signs or signals constitute an effective advertising medium during nighttime hours, a variety of factors can reduce or eliminate the economic feasibility of supplying electricity to these signs. Such factors might include the remoteness of a given location from available power supplies or the expense of providing such electric power.

For these reasons, various attempts have been made to develop solar powered generating systems which would transform the sun's energy into electricity which could be stored in batteries. This electricity may be later directed to provide electric power to an illuminated sign or other electrically dependent device during the nighttime hours.

Many such attempts to produce a solar powered sign or signal have resulted in systems whereby solar panels have been remotely or incidentally attached to the sign or signal itself. This arrangement, however, has required a separate means for mounting the solar panels in a position above or proximate to the sign. The result has added complexity in the construction of the sign as well as greater exposure of the solar panel structure to adverse weather conditions. The placement of panels above or proximate to the signs has served to advertise the existence and identity of the solar panels, resulting in increased theft and vandalism.

SUMMARY OF THE INVENTION

The present invention overcomes many of the disadvantages of prior art sign or signal systems employing solar technology.

The present invention relates generally to the use of photovoltaic cells to power a recharge system for replenishing one or more slow discharge batteries, which may then be used at selected times to power a variety of systems including illuminated signs. This new system may be used, for example, in providing battery power to signs, post and panel directional signals, security systems, as well as a variety of conventional and new lighting systems.

More particular aspects of the invention include solar modules mounted about the periphery of a sign or other electrical component structure and are integrated in the outer facing of the structure by specially designed low profile channels. These channels form the outer edges of the sign or other structure and hold the solar modules securely in place. A specially designed top or cap channel is fitted with solar modules and then bridged along the top or side of the sign in order to complete the circuit.

The solar module array is electrically connected to one or more energy storing devices which may be placed either within or below the structural framework of a given electrical component. In particular embodiments of the invention, the solar modules may be linked in series or parallel or in combinations thereof. In one embodiment of the invention, a voltage regulator is wired between the solar module array and the battery.

The battery is wired to an illumination means of the sign or other desired electrical load. In one embodiment of the invention, a timer or controller is wired between the electrical load and the battery. In another embodiment of the invention, a photoelectric eye may be wired to this timer in a manner to actuate the electrical load at a particular time or under particular lighting conditions.

Thus, the adjustable timer/controller means may allow the sign to be "on" for a desired length of time. It may also monitor the battery charge level, and automatically turn the sign or other load off if the batteries are low.

The solar module, itself, is composed of a thin film photovoltaic plate or other photovoltaic material which is sandwiched between a transparent cover plate and a rigid back plate. One or more continuous conductor wires are cast into this back plate. An electrical connection between the continuous conductor(s) and the solar panels may be provided through a spring or other conductive means positioned between the positive or negative side of the photovoltaic panel and the continuous conductor. This configuration is designed to prevent the solar modules from being assembled improperly. The conductors can be placed to permit the panels to be connected in parallel or in series.

In one embodiment of the device, a diode is wired to a positive conductor of each module. In one embodiment sub-array of blocking diodes electrically separate the respective sides of the sign preventing inadvertent power losses because different sides of a sign or structure will normally receive different amounts of sunlight during the course of each day. Thus if one side of the sign or structure is occasionally shaded, it will not dissipate energy from the panels on the other sides which are exposed to sunlight. The integration of a diode into each solar module also serves to prevent power loss due to damage or shading to one or more of the modules in the module array.

In yet another embodiment of the device, a laminate material is interposed between the thin film photovoltaic plate and the cover and back plates. The addition of this laminate material serves to moderate any detrimental expansion differential between the exterior plate material and the material comprising the inner photovoltaic plate.

The modular solar generating system described has many advantages over the prior art. The present system is completely self-contained, will automatically turn on and off, and requires no external power source or control. Additionally, the system is comprised of energy producing photovoltaic solar modules which form an integral yet inconspicuous structural component of the system. Thus simplifies set up of the structure while greatly reducing the incidence of vandalism and theft of the modules themselves. Integration of the modules in this fashion also serves to aesthetically improve the appearance of the sign or structure over similar structures described in the prior art.

The present system eliminates the need for costly electrical hookup during installation, and in many cases, can be installed less expensively than conventional power systems. It also allows for flexibility of movement without the danger of disturbing or interfering with underground utilities, such as phone cables and sprinkler systems. The system conserves energy and reduces utility cost because it is completely solar powered. However, it may also be backed up by conventional electric service or as a back up to conventional electric service. The system can also provide power to systems that would otherwise be inoperative during interruptions in electrical service.

The design of the photovoltaic modules themselves also demonstrates advantages over the prior art. First, each module is comprised of a plug means that eliminates the need for a separate wiring of the modules. By eliminating the external wiring required to interconnect the solar panels, system reliability is improved and costly manufacturing steps are eliminated. The present invention also affords greater design flexibility with few dimensional constraints.

Each module is comprised of male and female coupling means which may be quickly attached or detached depending on any given application. The design of the present solar module enables rapid and simple modification of the solar collecting surface area by the addition or deletion of modules from the system.

Another feature of this design is the structural strength imparted to the module by the incorporation of the continuous plug connectors. Two or more continuous connector wires are encapsulated into the module body, forming the male and female ends of the plug connectors. This arrangement imparts additional strength and rigidity to the module, reducing damage due to flexing during manufacturing, transportation, service and use. Thus, the electrical connector comprises a structural component as well as an electrical conductor and connector.

BRIEF DESCRIPTION OF THE DRAWINGS

FIG. 1 illustrates a perspective view of one embodiment of the modular generating system. A portion of the display surface is broken away to illustrate the interior of the sign.

FIG. 2 provides a perspective view of yet another embodiment of the modular generating system.

FIG. 3A generally illustrates a perspective view of the peripheral module assembly.

FIG. 3B provides a detail perspective view of the corner channel attachment assembly.

FIG. 3C illustrates a detail view of the top or cap channel attachment assembly as taken through plane C—C of FIG. 3B.

DETAILED DESCRIPTION OF THE PREFERRED EMBODIMENTS OF THE INVENTION

Figure 4:
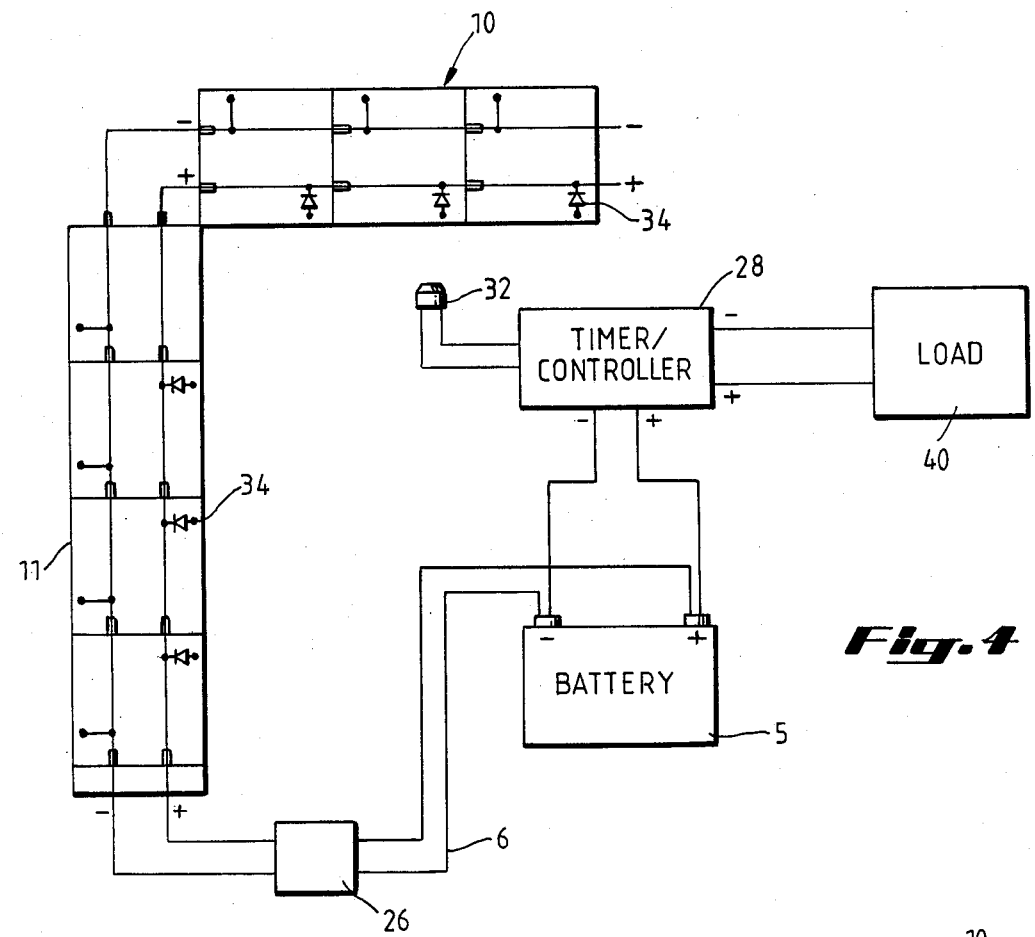
FIG. 4 illustrates a schematic wiring diagram representing one embodiment of the modular system.

FIG. 1 generally illustrates the component parts of the modular solar generating system 12. In one embodiment of the present invention, solar modules 10 are interconnectedly disposed in a module array about the periphery of a rigid frame 2. Frame 2 comprises one or more legs 3 for supporting the frame 2 above the mounting surface 4. A battery 5 (including but not limited to deep cycle gel cell batteries) is electrically connected by a power line 6 to the solar module array. The power line 6 may run in the interior of one or more of the legs 3 as shown. The battery 5 may be buried or recessed beneath the mounting surface to hide it from view and to protect it from the elements. A cover (not shown) may be required to service the battery 5 and keep rain and other moisture out of the recess housing the battery 5. Also linked to the battery 5 is a lighting means 8. In one embodiment of the device, a regulator 7 is linked between the solar module array 1 and the battery 5. A translucent face plate 9 is disposed within the frame 2 and may include thereon lettering, messages, logos, or the like that form the subject of the display.

FIG. 2 illustrates the component parts of another embodiment of the present invention. In this embodiment, a plurality of solar modules 10 are interconnectedly disposed about the perimeter of the sign system 12. This drawing illustrates the positioning of the continuous conductors 13 in the modules 10. At the top corners of the frame 2 where the solar modules 10 abut, a corner connector piece 14 is positioned to form an electrical connection between the modules lining the top and the sides of the sign system 12. Also in this embodiment of the present invention, a battery 5 is positioned on a removable tray 16 slidably mounted on the base of the sign frame 2. An insulating material 17, such as foam or other suitable material, may be incorporated into the outer structural panels 18 forming the base of the sign system 12. In this embodiment also, a reflective surface 20 is disposed within the sign frame 2 to maximize the illumination of the lighting means 8. A translucent face plate 9 is fitted within the frame 2 and may include lettering, messages, logos, etc., that form the subject of the display.

FIG. 3A illustrates in detail the way in which the solar modules 10 are connected. Modules 10(a) and (b) disposed in the same plane are connected by plugging the male end 16 of leads 13 of module 10(a) into the female end 17 and of module 10(b). Modules 10(a) and (c) are disposed in different planes. Modules 10(a) and (c) are connected by a connector 14. The male ends 16 of the connector 14 are plugged into female ends of module 10(a). The male ends 16 of module 10(c) are plugged into the female ends 17 of the connector 14.

A battery connector piece 29 is attached to a module 10(d) by the plug connectors 16 and 17. Electrical leads 6 from the connector 29 run to the battery (not shown).

Referring to FIGS. 3A, 3B, and 3C, threaded connectors 21 disposed normal to the plane of the modular array are attached to the bottom of the channel 22 in which the modules are slidably mounted. The connectors 21 make it possible to anchor the modular array to the structure framework 24 by means of wing nuts 25 or other suitable fastening means.

Referring in particular to FIGS. 3B and 3C, the channel 22 may be attached to the frame 2 or legs 3. In an alternate embodiment, the frame 2 and legs 3 may be so designed as to define the channel 22. This feature reduces the number of components necessary for the construction of the system 12. In this fashion, the solar modules themselves would form at least one supporting face of the frame 2 and leg members 3.

FIG. 4 generally illustrates an electrical schematic for the embodiments of FIGS. 1–3 and includes the modules 10 of the solar array. The battery 5 is electrically connected to the array combination. In some applications, it may be desirable to connect a voltage regulator 26 to the circuit between the solar array and the battery 5. A timer/controller 28 may be wired in the circuit between the battery 5 and the load 40. Various timers may be used including but not limited to multiple stage timers. It may also be desirable to wire a photoelectric eye 32 to the timer 28. In some applications it may be advantageous to shield the photoelectric eye 32.

In a preferred embodiment of the present invention, it is desirable to insert a diode 34 in the circuit of each solar module 10 as shown. The diode 34 to the positive lead is selected to prevent undesired flow of current from those areas illuminated by sunlight to those areas not so illuminated. The placement of the diode also prevents leakage from power producing modules to a damaged module, and also prevents power leakage from the battery 5 to the module 10 at night.

Figure 5A:
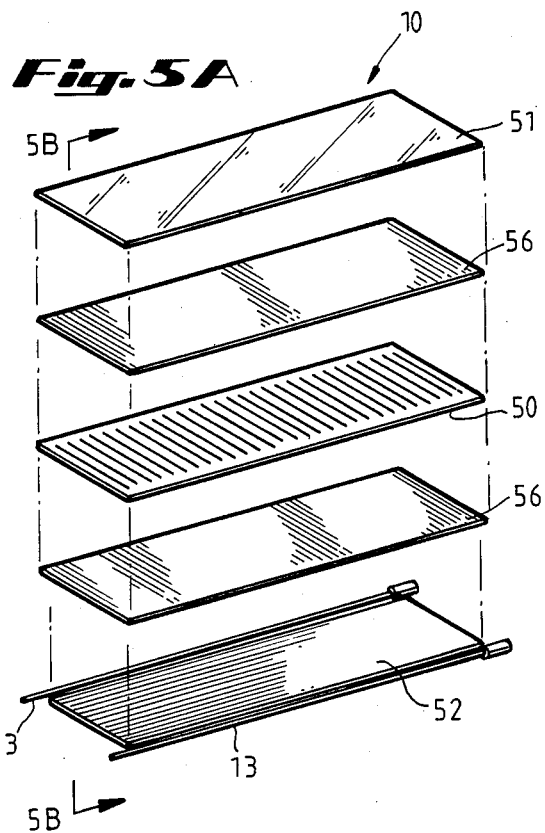
FIG. 5A illustrates an exploded view of one embodiment of the solar module.
Figure 5B:
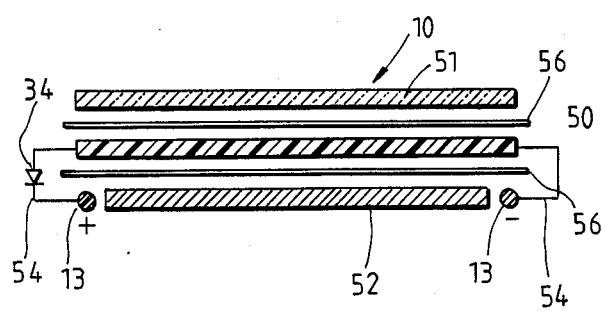
FIG. 5B illustrates a detailed end view of one embodiment of the solar module as taken through plane B—B of FIG. 5A.

FIGS. 5A and 5B illustrate in an exploded view the component parts of each solar module 10. In one embodiment, a thin film photovoltaic plate 50 is sandwiched between a transparent cover sheet 51 and a rigid back sheet 52. The cover sheet 51 may be made of such transparent materials as glass, LEXAN, TEDLAR, urethane or acrylic polymers, etc. The back sheet 52 may be comprised of such materials as steel, glass, acrylic or urethane polymers, etc., to provide additional structural rigidity to the solar module 10. Continuous, parallel conductors 13 are aligned with or disposed within the bottom sheet 52 and are connected to the photovoltaic plate 50 by a suitable connector means 54. In some applications, a diode 34 may be wired between the positive conductor 13 and the photovoltaic plate 50. In other applications, it may be necessary to insert a suitable laminate material 56 such as silicone, between the top plate 51 and the back plate 52 as to moderate undesired differences in expansion rates between the photovoltaic plate 50 and the top and back plates 51 and 52. In other applications, it may be desirable to encapsulate the entire module including the photovoltaic plate 50, the top and back plates 51 and 52 and the continuous conductors 13, in a transparent material such as acrylic, urethane, silicone, TEDLAR, LEXAN, etc. as to better insulate the module components from adverse conditions as well as providing additional rigidity to the modules themselves.

What is claimed is:

1. A modular solar generating system suitable for providing power for illuminated signs and other electrical loads comprising:
   a plurality of photovoltaic modules removably interconnected in an array as to convert incident solar radiation into electrical energy;
   a mounting frame adapted to support and contain said array where the array comprises an outer facing portion of the frame;
   a battery connected to said array adapted to receive and store electrical energy generated by said modules; and
   timing means connected to said battery for selective energization of an electrical load by electrical energy stored in the battery during a preselected time.

2. The system as defined in claim 1 wherein the electrical load comprises a lamp or other illumination means supported by the frame.

3. The system as defined in claim 1 wherein the mounting frame includes one or more leg members attachably joined so as to support the sign or other electrical means above the mounting surface.

4. The system defined in claim 3 wherein the solar modules are disposed about the perimeter of the mounting frame and supporting legs in order to provide maximum surface area for the collection of solar radiation.

5. The system defined in claim 4 wherein a channel member extends along the top and sides of the frame and continues downwardly along one or more leg members, said channel configured to receive and mount said modules so that the outer radiation receiving surface of the modules forms the perimeter of the sign.

6. The system as defined in claim 5 wherein corner connectors are slidably disposed within two or more peripheral channels to prevent removal of said connectors and solar modules to which the connectors are removably attached.

7. The system as defined in claim 6 wherein the solar modules are interconnectedly mounted about the periphery of said mounting frame within said channel, and are positioned to where the radiation receiving surfaces of the modules are directed outward.

8. The system as defined in claim 7 wherein the solar modules include male and female plug connectors at each end.

9. The system as defined in claim 8 wherein the battery includes one or more deep cycle gel-cell batteries.

10. The system as defined in claim 9 further comprising a shielded photoelectric eye connected between the battery and the electrical load and adapted to control current flow between the battery and the timing means at a selected level of illumination on the photoelectric eye.

11. The system as defined in claim 1 wherein the battery is removably connected to the solar module array.

12. The system as defined in claim 1 wherein the timing means comprises a multiple stage-timer capable of energizing an electrical load at different times.

13. An integrated solar-powered, electrical display comprising:
   a base adapted to house a battery;
   a frame mounted on the base and adapted to mount the display to the periphery of the frame;
   an array of photovoltaic cells mounted end-to-end around the periphery of the frame;
   a first electrical circuit disposed between the battery and photovoltaic cells adapted to supply energy collected by the photovoltaic cells to the battery; and
   a second electrical circuit disposed between the battery and the electrical display adapted to supply power from the battery to the electrical display or an other electrical load.

14. A display according to claim 13 where a timer/controller means is disposed in the second electrical circuit between the battery and the display.

15. A display according to claim 13 where a photoelectric eye is disposed in the second electrical circuit between the battery and the display.

16. A display according to claim 13 where an electrical control device is disposed in the first electrical circuit between the battery and the photovoltaic cell.

* * * * *